(12) United States Patent
Hossain et al.

(10) Patent No.: US 11,538,753 B2
(45) Date of Patent: Dec. 27, 2022

(54) ELECTRONIC CHIP WITH UNDER-SIDE POWER BLOCK

(71) Applicant: Intel Corporation, Santa Clara, CA (US)

(72) Inventors: MD Altaf Hossain, Portland, OR (US);
Ankireddy Nalamalpu, Portland, OR (US); Scott Gilbert, Aloha, OR (US);
Jin Zhao, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 300 days.

(21) Appl. No.: 16/465,255

(22) PCT Filed: Dec. 30, 2016

(86) PCT No.: PCT/US2016/069577
§ 371 (c)(1),
(2) Date: May 30, 2019

(87) PCT Pub. No.: WO2018/125231
PCT Pub. Date: Jul. 5, 2018

(65) Prior Publication Data
US 2019/0333854 A1  Oct. 31, 2019

(51) Int. Cl.
*H01L 23/48* (2006.01)
*H01L 23/528* (2006.01)
*H01L 23/498* (2006.01)

(52) U.S. Cl.
CPC ........ *H01L 23/5286* (2013.01); *H01L 23/481* (2013.01); *H01L 23/49822* (2013.01)

(58) Field of Classification Search
CPC . H01L 23/48; H01L 23/481; H01L 23/49822; H01L 23/50; H01L 23/5286
See application file for complete search history.

(56) References Cited

U.S. PATENT DOCUMENTS

| 6,268,660 | B1 * | 7/2001 | Dhong | H01L 23/481 |
| | | | | 257/738 |
| 6,992,899 | B2 * | 1/2006 | Alger | H05K 1/141 |
| | | | | 174/260 |

(Continued)

FOREIGN PATENT DOCUMENTS

| EP | 1515365 A2 | 3/2005 |
| WO | WO-2014070586 A1 | 5/2014 |
| WO | WO-2018125231 A1 | 7/2018 |

OTHER PUBLICATIONS

"International Application Serial No. PCT US2016 069577, International Preliminary Report on Patentability dated Jul. 11, 2019", 6 pgs.

(Continued)

*Primary Examiner* — Julia Slutsker
*Assistant Examiner* — Dmitriy Yemelyanov
(74) *Attorney, Agent, or Firm* — Schwegman Lundberg & Woessner, P.A.

(57) ABSTRACT

An electronic chip, system, and method includes a power block including a power source configured to provide power to components of the electronic chip and a relay circuit coupled to the power source and a ground plane. The electronic chip further includes chip package having a first major side and a second major side, the power block secured to the second major side, the chip package comprising electrical connections, disposed on the second major side, to be secured with respect to a circuit board, and interconnect circuitry, electrically coupling the power block to ground, comprising a plurality of conductive layers, a conductive through hole, electrically connecting a first pair of the plurality of conductive layers, having a first width, and a via, (Continued)

electrically connecting a second pair of the plurality of conductive layers, having a second width less than the first width.

20 Claims, 4 Drawing Sheets

(56) References Cited

U.S. PATENT DOCUMENTS

| | | |
|---|---|---|
| 2004/0124511 A1 | 7/2004 | Li |
| 2005/0263867 A1* | 12/2005 | Kambe ................ H05K 3/4602 257/E23.079 |
| 2007/0120249 A1* | 5/2007 | Kawamoto .......... H05K 1/0271 257/702 |
| 2013/0011965 A1 | 1/2013 | White et al. |
| 2014/0035155 A1* | 2/2014 | Tan ........................ H01L 23/58 257/774 |
| 2015/0348962 A1 | 12/2015 | Chao et al. |
| 2016/0204058 A1* | 7/2016 | Oyamada ................ H01L 23/50 257/778 |
| 2016/0293572 A1* | 10/2016 | We ...................... H01L 23/3114 |
| 2017/0053900 A1* | 2/2017 | Kawaminami ..... H01L 25/0657 |

OTHER PUBLICATIONS

"Internationai Application Serial No. PCT/US2016/069577, International Search Report dated Sep. 28, 2017", 3 pgs.
"International Application Serial No. PCT/US2016/069577, Written Opinion dated Sep. 28, 2017", 4 pgs.

* cited by examiner

ELECTRONIC CHIP WITH UNDER-SIDE POWER BLOCK

This application is a U.S. National Stage Filing under 35 U.S.C. 371 from International Application No. PCT/US2016/069577, filed on Dec. 30, 2016, which is incorporated herein by reference in its entirety.

TECHNICAL FIELD

The disclosure herein relates generally to an electronic chip with a power block on the under-side of a chip package.

BACKGROUND ART

Electronic chips conventionally include a die, a package, and a power source. The power source supplies power to the die and to the electronic chip in general through electrical interconnects between the power source and the rest of the electronic chip. The package may provide internal interconnects to route power from the power source to the die and elsewhere in the electronic chip.

DESCRIPTION OF THE EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The efficiency of power transfer from the power source to components of the electronic chip may be based on a variety of factors, including but not limited to total distance and throughput of the interconnect architecture. A relatively short distance may provide for relatively fewer opportunities for loss in transmission. Lack of available capacity of the interconnect architecture may prevent even available power form being transmitted. Conventional chip architectures may present various disadvantages related to such efficiency. In particular, the power source may be sited at some distance from the die and the rest of the electronics owing to a lack of available space. In certain cases, the power source may be placed on a motherboard and power run from there to the chip. Moreover, even if the power source can be positioned in proximity of the die and other components of the electronic chip, the interconnect architecture may be incapable of or be inefficient at transmitting the power as generated.

An electronic chip has been developed that positions a power block having a power source on the underside of a chip package of the chip. Doing so creates available space to position the power block in relatively close proximity of the die and other components of the electronic chip. Further, the electronic chip includes an interconnect architecture that utilizes relatedly large-width through holes in addition to relatively small-width vias. Though certain implementations of the through holes may result in a relatively more complicated manufacturing process than using vias alone, the through holes may also provide a low-loss, short path from the power block to the components of the electronic chip. The resultant architecture may have relatively better power efficiency than other architectures, on the order of two to three percent or more.

Figure 1:
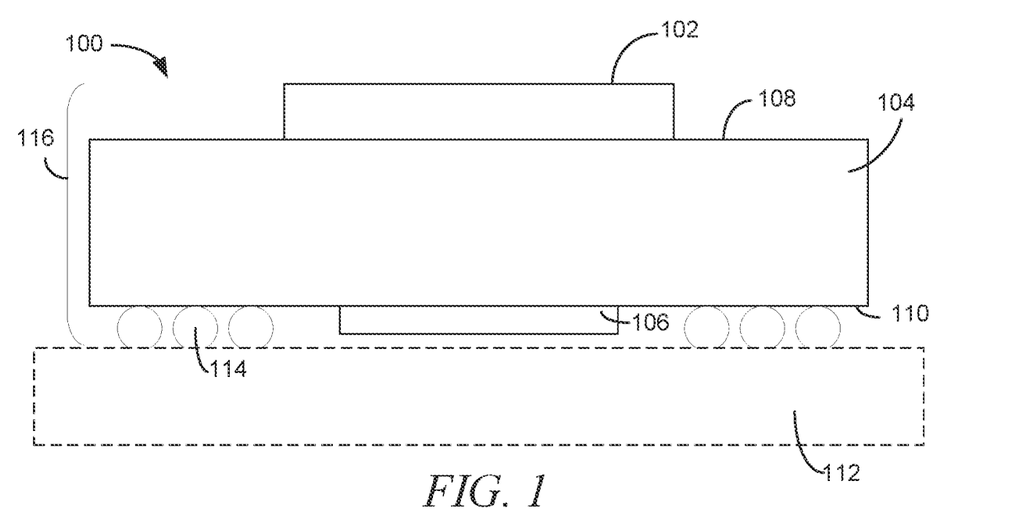
FIG. 1 is a side view of an electronic chip, in an example embodiment.

FIG. 1 is a side view of an electronic chip 100, in an example embodiment. The electronic chip includes a die 102, a chip package 104, and a power block 106. The die 102 is secured to a first major side 108 of the chip package 104 while the power block 106 is secured to a second major side 110 of the chip package 104. As illustrated, the second major side 110 faces a board 112, such as a printed circuit board (PCB), which is not necessarily a component of the electronic chip 100, and as such the power block 106 is secured between the chip package 104 and the board 112. The first major side 108 faces away from the board 112. Stated another way, the power block 106 is secured to the bottom surface of the chip package 104 and of the electronic chip 100 in general. Electrical connections 114, such as ball grid array (BGA) connections, are disposed on the second major side 110. The electrical connections 114 are electrically coupled to components of the electronic chip 100, such as the die 102, and are coupleable to the board 112, both to provide an electrical connection between components of the electronic chip 100 and the board 112 and to mechanically secure the electronic chip 100 to the board 112.

By positioning the power block 106 on the bottom side, i.e., the second major side 110 of the chip package 104 and the electronic chip 100 as a whole, a height 116 may be minimized in relation to other architectures of other electronic chips, as the power block 106 effectively does not contribute to the height 116 of the electronic chip 100. In addition to or because of the reduction in height, the electronic chip 100 may have relatively greater structural rigidity than other electronic chip architectures owing to the reduced height and/or the additional rigidity provided by the power block 106 being coupled directly or effectively directly (i.e., with only minimal other structure) to the chip package 104.

It is noted that while the die 102 and power block 106 are illustrated and described in the particular arrangement of the illustrated example, alternative examples may allow for alternative arrangements that are still within the scope and spirit of the instant disclosure. Thus, in an example, both the die 102 and the power block 106 are located on the second major side 110 provided sufficient space is available for both components. Additionally or alternatively, both the die 102 and the power block 106 are located on the first major side 108, or the die 102 may be on the second major side 110 and the power block 106 on the first major side 108.

Figure 2:
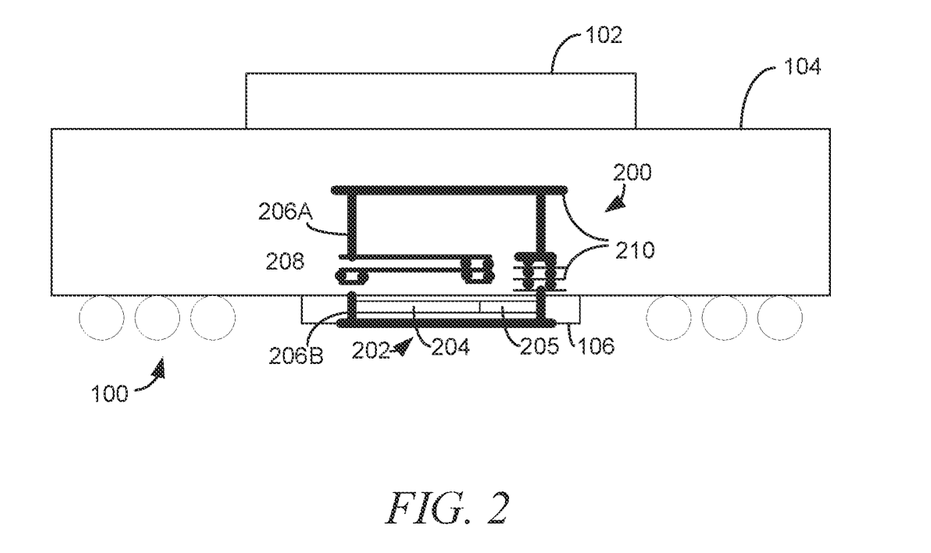
FIG. 2 is a side schematic of an electronic chip, in an example embodiment.

FIG. 2 is a side schematic of the electronic chip 100, in an example embodiment. The electronic chip 100 includes interconnect circuitry 200 of the chip package 104 electrically coupled to a power block interconnect 202. The power block 106 further includes a power source 204 electrically coupled to the power block interconnect 202 via a relay circuit 205, the power source 204 configured to generate power utilized by components of the electronic chip 100. It is noted that the side schematic of FIG. 2 is simplified and does not necessarily illustrate either all of the components of the electronic chip 100 generally or all of the interconnect circuitry 200 or power block interconnect 202, specifically.

In the illustrated example, the interconnect circuitry 200 and the power block interconnect 202 each include at least one conductive through hole 206A, 206B and, in the case of the interconnect circuitry 200, at least one via 208 extending between and electrically coupling a plurality of conductive layers 210, e.g. copper traces, with respect to one another. It is noted that the power block interconnect 202 may further incorporate vias 208, though vias 208 of the power block interconnect 202 are not illustrated here. The vias 208 may be micro-vias manufactured according to conventional techniques and according to conventional specifications. As such, the vias 208 may, in an example implementation have a width (e.g., a diameter of a circular via 208) of approximately four hundred (400) to seven hundred (700) micrometers, though it is emphasized that the vias 208 may have any conventional dimensions that may be realized and utilized for vias in any contemporary chip package architecture.

In contrast, the conductive through holes 206A, 206B have a width greater than that of the vias 208. The conductive through holes 206A, 206B may be a mechanically drilled through hole, in an example a plated through hole, though alternative through holes, such as a core-less through hole, may be utilized instead of or in addition to the plated through hole or other mechanically drilled through holes. In various examples, the interconnect circuitry 200 the power block interconnect 202 may utilize gold-to-gold interconnect technology to bond the chip package 104 and the power block 106 with respect to one another, or any other suitable manufacturing technique.

In an example, the power source 204 delivers from three (3) to six (6) Watts of DC power, though it is to be recognized and understood that any suitable power source 204 may be utilized. The conductive through holes 206A. 206B are sized and formed to accommodate such power throughput. In contrast to alternative architectures of electronic chips, the electronic chip 100 may reduce power loss from the power source 204 to other components of the electronic chip 100, such as the die 102, from two (2) to three (3) percent, thereby reducing loss by anywhere from sixty (60) milliWatts to one hundred eighty (180) milliWatts in the above example. This reduction in power loss may reduce power consumption, owing to a reduced power delivery requirement for the power source 204, as well as improve performance of the electronic chip and improve manufacturing yields owing to the reduced power requirements on the order of from six (6) to ten (10) percent.

In general, the power block 106 may have a relatively high voltage input and a low voltage output, corresponding to a relatively high output current. Where the power block 106 is positioned relatively far away from the components of the electronic chip 100, e.g., on the board 112, the amount of conductor (e.g., cumulative of the electrical connections 114, the interconnect circuitry 200, and so forth) over which the current passes before reaching the components of the electronic chip 100 produces correspondingly greater system impedance, which may tend to necessitate relatively large amounts of offsetting capacitance and inductance in the power block 106, increasing the size of the power block 106.

Placing the power block 106 on the second major side 110, in contrast to on the board 112 or elsewhere, may reduce the current the power block 106 needs to drive and reduces overall system impedance. For instance, in an example, the voltage input for the power block 106 as positioned on the second major side 110 may be two (2) Volts while the output voltage may be one (1) Volt, meaning that the input current may be half as large as the output current. To drive and equivalent amount of current from a power block 106 positioned on the board 112, at least twice as much conductor may be required or otherwise utilized. Because power loss along the path may, definitionally, be the square of the current multiplied by the total impedance, power loss may be reduced by three-quarters or more by placing the power block 106 on the second major side 110.

Because the impedance is relatively lower by placing the power block 106 on the second major side 110 in comparison with other locations off of the electronic chip 100, the resultant impedance and capacitance included in the power block 106 may be reduced. The effect of reducing the impedance and capacitance may inherently produce an increase in the switching frequency of the relay circuit 205.

The practical effect of positioning the power block 106 on the second major side 110, in contrast, e.g., to on the board 112, and providing a suitable interconnect architecture may be to increase the Q factor of the underlying RLC circuit created by the power source 204 and componentry of the electronic chip in general. The Q factor, as known in the art, is defined as the ratio of energy stored over power loss multiplied by the angular resonant frequency of the circuit. By shortening the distance over which power travels from the power block 106 to the other components of the electronic chip 100 and by minimizing the intrinsic capacitance and resistance of the interconnect architecture, the Q factor may inherently be increased, translating into reduced power loss.

The configuration of the power block 106 allows for the power block 106 to optionally supply power to multiple independent power domains. Each power domain may incorporate its own relay 205 and/or RLC filter with a specified frequency. As such, the power block 205 is not limited to a single power domain and the components and principles described herein may be applied to multiple domains and power specifications, as desired.

Figure 3:
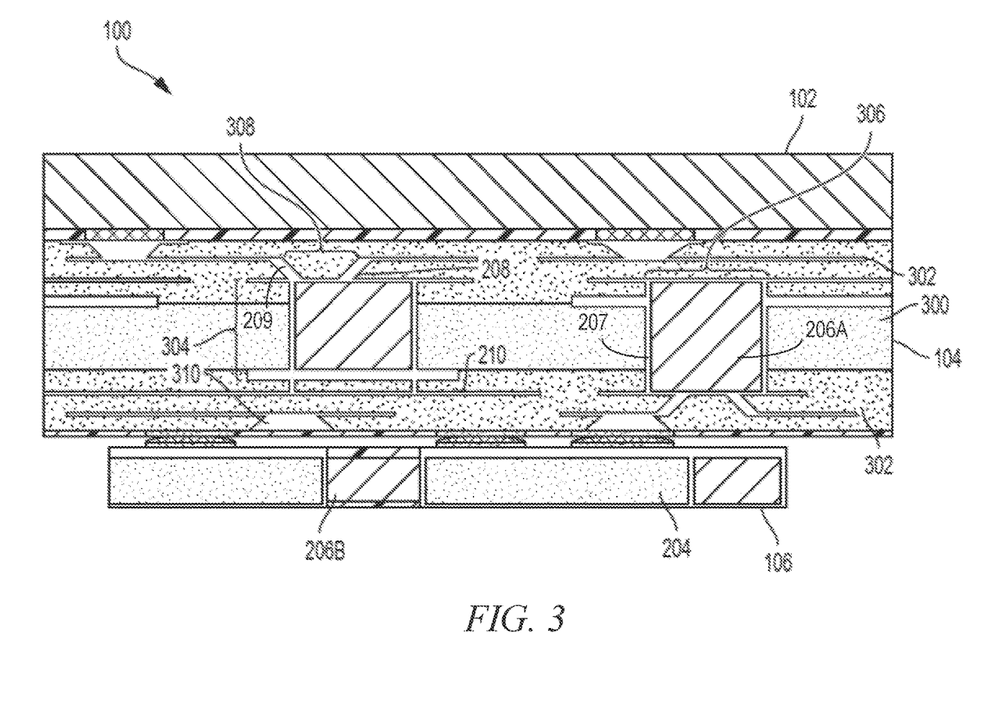
FIG. 3 is a side view of a cross section of an electronic chip, in an example embodiment.

FIG. 3 is a side view of a cross section of the electronic chip 100, in an example embodiment. The chip package 104 includes a core 300 and conductive layers 210, which are embedded in an insulator 302. The insulator 302 may include one or more buildup layers 302, such as an Ajinomoto build-up film (ABF). The conductive through holes 206A, 206B and the vias 208 extend through the insulator 302. The conductive through holes 206A, 206B include through hole conductive material 207 and the vias 208 include via conductive material 209. The power block 106 includes the power source 204 and conductive through holes 206A, 206B. It is note that, in the illustrated example, the conductive through holes 206A, 206B of the chip package 104 have different dimensions than the conductive through holes 206A, 206B of the power block 106, having both differing heights 304 and widths 306. However, in various examples, the widths 306 of the various conductive through holes exceed the widths 308 of the vias 208. A gold-to-gold interconnect 310 bonds and electrically couples the power block 106 to the chip package 104 and, as illustrated, the die 102 to the chip package 104, though it is emphasized that any suitable interconnect may be utilized to bond the die 102, chip package 104, and power block 106 with respect to one another.

As illustrated, there are an equal number of layers 210A above the core 300 as layers 210B below the core 300. In such an example, the chip package 104 is a symmetric chip package. However, in various examples, the positioning of the power block 106 on the second major side 110 of the chip package 104 may allow for more layers 210B below the core 300 than above, providing for an asymmetric chip package. In such examples, one or more additional layers 210B below the core 300 may allow for relatively more efficient power delivery to the core 300 specifically and to components of the electronic chip 100 generally than may be practical in a symmetric chip package.

Figure 4:
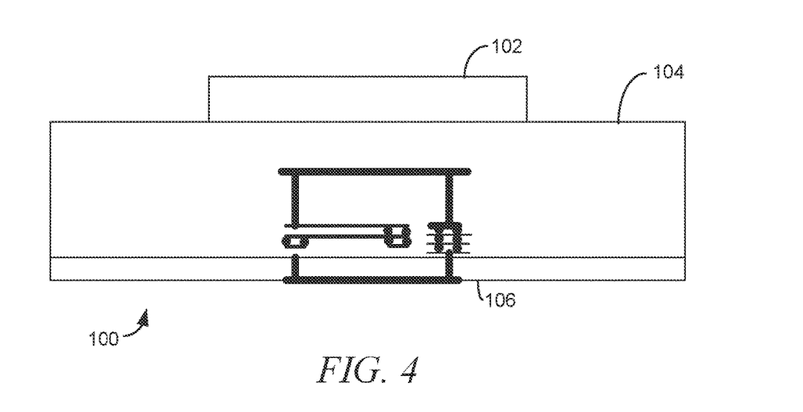
FIG. 4 is a side schematic of an electronic chip in an intermediate manufacturing phase.

FIG. 4 is a side schematic of the electronic chip 100 in an intermediate manufacturing phase, in an example embodiment. As illustrated, the electronic chip 100 is depicted following a final lamination step but prior to milling the power block 106 and attaching the electrical connections 114. Milling the power block 106 may be according to any suitable technology known in the art. The power block 106 of FIG. 4 therefore is of a first size larger than a second size of the power block 106 illustrated in other figures and in the final manufactured form of the electronic chip 100. Milling of the power block 106 provides space for the placement of at least one, and in the illustrated example, all of the electrical connections 114.

Figure 5:
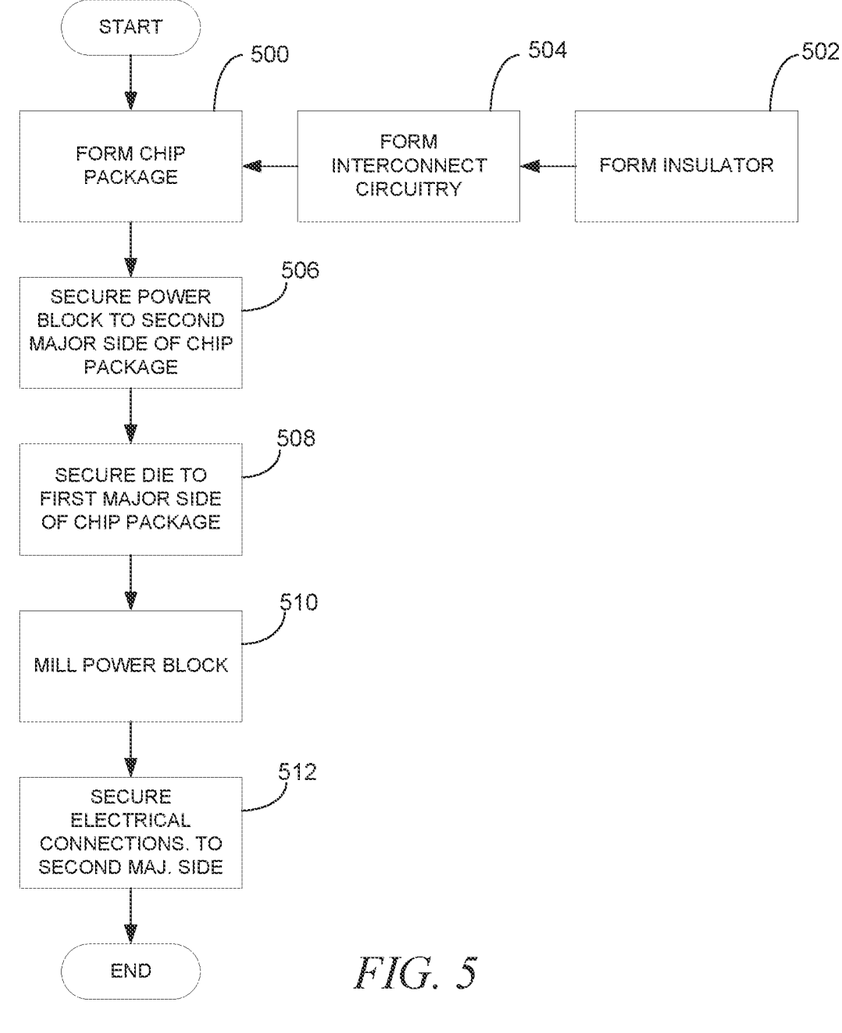
FIG. 5 is a flowchart for making an electronic package.

FIG. 5 is a flowchart for making an electronic chip, in an example embodiment. The electronic chip may be the electronic chip 100 or any other suitable electronic chip.

At 500, a chip package is formed, the chip package having a first major side and a second major side.

At 502, an insulator is formed.

At 504, interconnect circuitry is formed, the interconnect circuitry being embedded in the insulator, the interconnect circuitry including a plurality of conductive layers, a conductive through hole, electrically connecting a first pair of the plurality of conductive layers, having a first width, and a via, electrically connecting a second pair of the plurality of conductive layers, having a second width less than the first width. In an example, forming the interconnect circuitry comprises mechanically drilling the conductive through hole, the conductive through hole being a mechanical drill through hole. In an example, forming the interconnect circuitry comprises plating the mechanical drill through hole to form a plated through hole. In an example, the mechanical drill through hole is a coreless through hole. In an example, forming the interconnect circuitry comprises forming gold-to-gold interconnect circuitry.

At 506, a power block is secured to the second major side and electrically coupling the power block to the interconnect circuitry, the power block including a power source configured to provide power to components of the electronic chip and a relay circuit coupled to the power source and a ground plane. In an example, the power block further comprises a power block interconnect, and wherein electrically coupling the power block to the interconnect circuitry comprises electrically coupling the power block interconnect to the interconnect circuitry of the chip package, the power block interconnect comprising at least one conductive through hole.

At 508, a die is secured to the first major side and electrically coupling the die to the power source via the interconnect circuitry At 510, the power block is milled from a first size to a second size smaller than the first size, wherein securing the electrical connections comprises securing at least one of the electrical connections to a portion of the second major side previously occupied by the power block prior to milling At 512, electrical connections are secured to the second major side and the electrical connections are electrically coupled to the interconnect circuitry.

Figure 6:
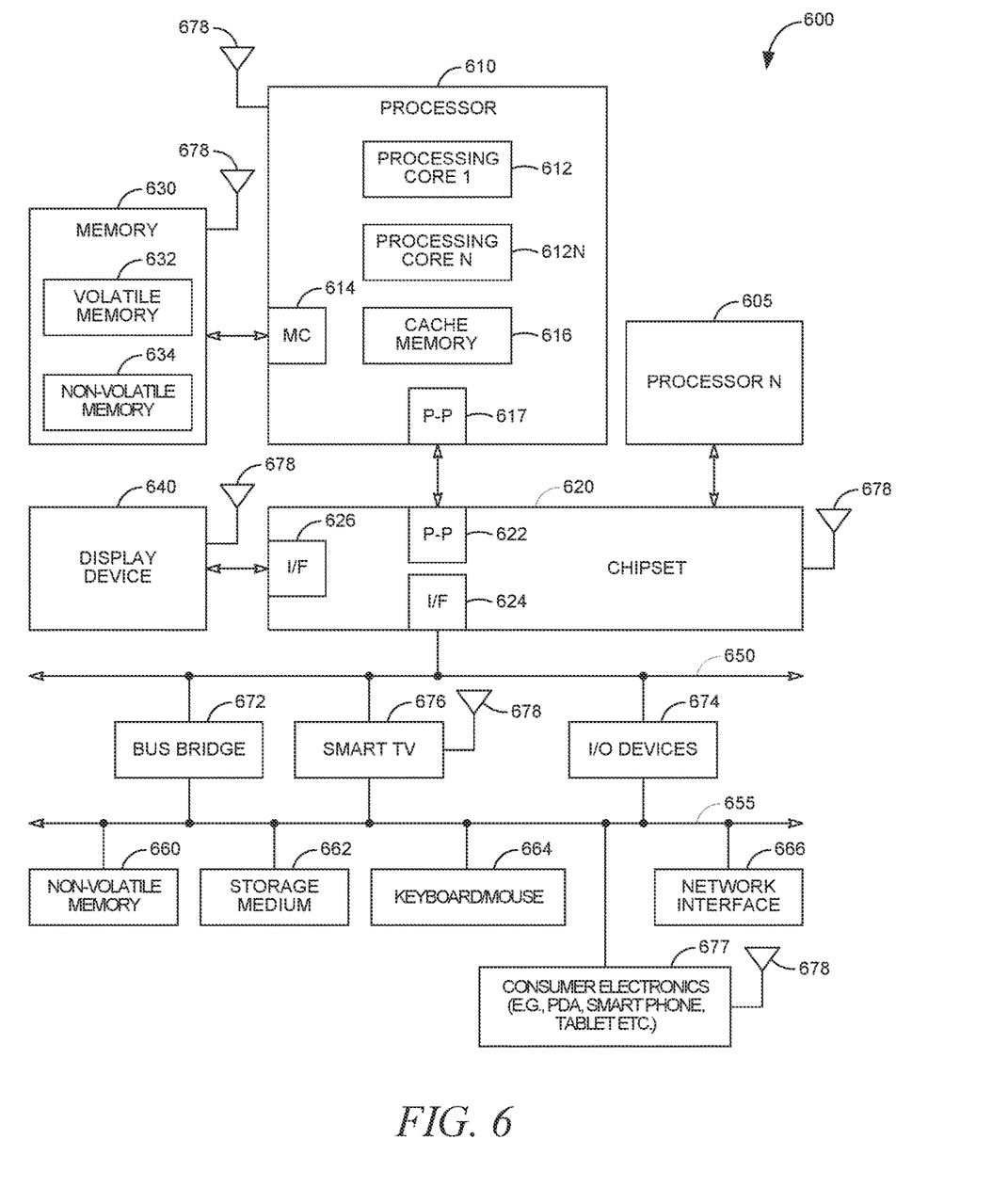
FIG. 6 illustrates a system level diagram, depicting an example of an electronic device (e.g., system) including an electronic chip, in an example embodiment.

FIG. 6 illustrates a system level diagram, depicting an example of an electronic device (e.g., system) including the electronic chip 100, in an example embodiment. FIG. 6 is included to show an example of a higher level device application for the electronic chip 100. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 is a system on a chip (SOC) system.

In one embodiment, processor 610 has one or more processor cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, an interface for wireless antenna 678 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the example system, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices, including a bus bridge 672, a smart TV 676, I/O devices 674, nonvolatile memory 660, a storage medium (such as one or more mass storage devices) [this is the term in Fig—alternative to revise Fig. to "mass storage device(s)"—as used in para. 8] 662, a keyboard/mouse 664, a network interface 666, and various forms of consumer electronics 677 (such as a PDA, smart phone, tablet etc.), etc. In one embodiment, chipset 620 couples with these devices through an interface 624. Chipset 620 may also be coupled to a wireless antenna 678 to communicate with any device configured to transmit and/or receive wireless signals.

Chipset 620 connects to display device 640 via interface 626. Display 640 may be, for example, a liquid crystal display (LCD), a plasma display, cathode ray tube (CRT) display, or any other form of visual display device. In some embodiments of the example system, processor 610 and chipset 620 are merged into a single SOC. In addition, chipset 620 connects to one or more buses 650 and 655 that interconnect various system elements, such as I/O devices 674, nonvolatile memory 660, storage medium 662, a keyboard/mouse 664, and network interface 666. Buses 650 and 655 may be interconnected together via a bus bridge 672.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

ADDITIONAL EXAMPLES

In Example 1, an electronic chip includes a power block, comprising a power source configured to provide power to components of the electronic chip and a relay circuit coupled to the power source and a ground plane. The electronic chip further includes chip package having a first major side and a second major side, the power block secured to the second major side, the chip package comprising electrical connections, disposed on the second major side, to be secured with respect to a circuit board, and interconnect circuitry, electrically coupling the power block to ground, comprising a plurality of conductive layers, a conductive through hole, electrically connecting a first pair of the plurality of conductive layers, having a first width, and a via, electrically connecting a second pair of the plurality of conductive layers, having a second width less than the first width.

In Example 2, the electronic chip of Example 1 optionally further includes that the conductive through hole is a mechanical drill through hole, In Example 3, the electronic chip of any one or more of Examples 1 and 2 optionally further includes that the mechanical drill through hole is a plated through hole.

In Example 4, the electronic chip of any one or more of Examples 1-3 optionally further includes that the mechanical drill through hole is a coreless through hole.

In Example 5, the electronic chip of any one or more of Examples 1-4 optionally further includes that the power block further comprises a power block interconnect, electrically coupled to the interconnect circuitry of the chip package, the power block interconnect comprising at least one conductive through hole.

In Example 6, the electronic chip of any one or more of Examples 1-5 optionally further includes that the interconnect circuitry is gold-to-gold interconnect circuitry.

In Example 7, the electronic chip of any one or more of Examples 1-6 optionally further includes a die, electrically coupled to the power source via the interconnect circuitry, and secured to the first major side.

In Example 8, a method includes forming a chip package having a first major side and a second major side, forming the chip package comprising forming an insulator and forming interconnect circuitry embedded in the insulator, the insulator comprising a plurality of conductive layers, a conductive through hole, electrically connecting a first pair of the plurality of conductive layers, having a first width, and a via, electrically connecting a second pair of the plurality of conductive layers, having a second width less than the first width. The method further includes securing a power block to the second major side and electrically coupling the power block to the interconnect circuitry, the interconnect circuitry comprising a power source configured to provide power to components of the electronic chip a relay circuit coupled to the power source and a ground plane. The method further includes securing electrical connections to the second major side and electrically coupling the electrical connections to the interconnect circuitry.

In Example 9, the method of Example 8 optionally further includes that forming the interconnect circuitry comprises mechanically drilling the conductive through hole, the conductive through hole being a mechanical drill through hole.

In Example 10, the method of any one or more of Examples 8 and 9 optionally further includes that forming the interconnect circuitry comprises plating the mechanical drill through hole to form a plated through hole.

In Example 11, the method of any one or more of Examples 8-10 optionally further includes that the mechanical drill through hole is a coreless through hole.

In Example 12, the method of any one or more of Examples 8-11 optionally further includes that the power block further comprises a power block interconnect, and wherein electrically coupling the power block to the interconnect circuitry comprises electrically coupling the power block interconnect to the interconnect circuitry of the chip package, the power block interconnect comprising at least one conductive through hole.

In Example 13, the method of any one or more of Examples 8-12 optionally further includes that forming the interconnect circuitry comprises forming gold-to-gold interconnect circuitry.

In Example 14, the method of any one or more of Examples 8-13 optionally further includes securing a die to the first major side and electrically coupling the die to the power source via the interconnect circuitry.

In Example 15, the method of any one or more of Examples 8-14 optionally further includes milling the power block from a first size to a second size smaller than the first size, wherein securing the electrical connections comprises securing at least one of the electrical connections to a portion of the second major side previously occupied by the power block prior to milling.

In Example 16, a system includes a circuit board and an electronic chip, secured and electrically coupled to the circuit board, the electronic chip comprising a power block, comprising a power source configured to provide power to components of the electronic chip and a relay circuit coupled to the power source and a ground plane. The electronic chip further includes chip package having a first major side and a second major side, the power block secured to the second major side, the chip package comprising electrical connections, disposed on the second major side, to be secured with respect to the circuit board, and interconnect circuitry, electrically coupling the power block to ground, comprising a plurality of conductive layers, a conductive through hole, electrically connecting a first pair of the plurality of conductive layers, having a first width, and a via, electrically connecting a second pair of the plurality of conductive layers, having a second width less than the first width.

In Example 17, the system of Example 16 optionally further includes that the conductive through hole is a mechanical drill through hole, In Example 18, the system of any one or more of Examples 16 and 17 optionally further includes that the mechanical drill through hole is a plated through hole.

In Example 19, the system of any one or more of Examples 16-18 optionally further includes that the mechanical drill through hole is a coreless through hole.

In Example 20, the system of any one or more of Examples 16-19 optionally further includes that the power block further comprises a power block interconnect, electrically coupled to the interconnect circuitry of the chip package, the power block interconnect comprising at least one conductive through hole.

In Example 21, the system of any one or more of Examples 16-20 optionally further includes that the interconnect circuitry is gold-to-gold interconnect circuitry.

In Example 22, the system of any one or more of Examples 16-21 optionally further includes a die, electrically coupled to the power source via the interconnect circuitry, and secured to the first major side.

Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An electronic chip, comprising:
    a power block, comprising:
    a power source configured to provide power to components of the electronic chip; and
    a relay circuit coupled to the power source and a ground plane;
    a chip package having a first major side and a second major side, the power block secured to the second major side; the chip package comprising:
    electrical connections, disposed on the second major side, to be secured with respect to a circuit board; and
    interconnect circuitry, electrically coupling the power block to ground, comprising:
    a plurality of conductive layers;
    a plurality of insulating layers, individual ones of the plurality of insulating layers positioned between individual ones of the plurality of conductive layers;
    a conductive through hole, electrically connecting a first pair of the plurality of conductive layers through a first one of the plurality of insulating layers with a through hole conductive material defining a first width and having a side wall perpendicular to the first and second major sides; and
    a via, electrically connecting a second pair of the plurality of conductive layers through a second one of the plurality of insulating layers with a via conductive material defining a second width less than the first width, the via electrically coupling the conductive through hole with another one of the plurality of conductive layers different than the first pair of the plurality of conductive layers.

2. The electronic chip of claim 1, wherein the conductive through hole is a mechanical drill through hole.

3. The electronic chip of claim 2, wherein the mechanical drill through hole is a plated through hole.

4. The electronic chip of claim 2, wherein the mechanical drill through hole is a coreless through hole.

5. The electronic chip of claim 2, wherein the power block further comprises a power block interconnect, electrically coupled to the interconnect circuitry of the chip package, the power block interconnect comprising at least one power block conductive through hole.

6. The electronic chip of claim 1, wherein the interconnect circuitry is gold-to-gold interconnect circuitry.

7. The electronic chip of claim 1, further comprising:
a die, electrically coupled to the power source via the interconnect circuitry, and secured to the first major side.

8. A method, comprising:
forming a chip package having a first major side and a second major side, comprising:
forming an insulator;
forming interconnect circuitry embedded in the insulator, comprising:
a plurality of conductive layers;
a plurality of insulating layers, individual ones of the plurality of insulating layers positioned between individual ones of the plurality of conductive layers;
a conductive through hole, electrically connecting a first pair of the plurality of conductive layers through a first one of the plurality of insulating layers with a through hole conductive material defining a first width and having a side wall perpendicular to the first and second major sides; and
a via, electrically connecting a second pair of the plurality of conductive layers through a second one of the plurality of insulating layers with a via conductive material defining a second width less than the first width, the via electrically coupling the conductive through hole with another one of the plurality of conductive layers different than the first pair of the plurality of conductive layers;
securing a power block to the second major side and electrically coupling the power block to the interconnect circuitry, comprising:
a power source configured to provide power to components of the electronic chip; and
a relay circuit coupled to the power source and a ground plane; and
securing electrical connections to the second major side and electrically coupling the electrical connections to the interconnect circuitry.

9. The method of claim 8, wherein forming the interconnect circuitry comprises mechanically drilling the conductive through hole, the conductive through hole being a mechanical drill through hole.

10. The method of claim 9, wherein forming the interconnect circuitry comprises plating the mechanical drill through hole to form a plated through hole.

11. The method of claim 9, wherein the mechanical drill through hole is a coreless through hole.

12. The method of claim 9, wherein the power block further comprises a power block interconnect, and wherein electrically coupling the power block to the interconnect circuitry comprises electrically coupling the power block interconnect to the interconnect circuitry of the chip package, the power block interconnect comprising at least one power block conductive through hole.

13. The method of any claim 8, wherein forming the interconnect circuitry comprises forming gold-to-gold interconnect circuitry.

14. The method of claim 8, further comprising:
securing a die to the first major side and electrically coupling the die to the power source via the interconnect circuitry.

15. The method of claim 8, further comprising milling the power block from a first size to a second size smaller than the first size, wherein securing the electrical connections comprises securing at least one of the electrical connections to a portion of the second major side previously occupied by the power block prior to milling.

16. A system, comprising:
a circuit board; and
an electronic chip, secured and electrically coupled to the circuit board, comprising:
a power block, comprising:
a power source configured to provide power to components of the electronic chip; and
a relay circuit coupled to the power source and a ground plane;
a chip package having a first major side facing away from the circuit board and a second major side facing the circuit board, the power block secured to the second major side, the chip package comprising:
electrical connections, disposed on the second major side, secured to the circuit board; and
interconnect circuitry, electrically coupling the power block to ground, comprising:
a plurality of conductive layers;
a plurality of insulating layers, individual ones of the plurality of insulating layers positioned between individual ones of the plurality of conductive layers;
a conductive through hole, electrically connecting a first pair of the plurality of conductive layers through a first one of the plurality of insulating layers with a through hole conductive material defining a first width and having a side wall perpendicular to the first and second major sides; and
a via, electrically connecting a second pair of the plurality of conductive layers through a second one of the plurality of insulating layers with a via conductive material defining a second width less than the first width, the via electrically coupling the conductive through hole with another one of the plurality of conductive layers different than the first pair of the plurality of conductive layers.

17. The electronic chip of claim 16, wherein the conductive through hole is a mechanical drill through hole.

18. The electronic chip of claim 17, wherein the mechanical drill through hole is a plated through hole.

19. The electronic chip of claim 17, wherein the mechanical drill through hole is a careless through hole.

20. The electronic chip of claim 17, wherein the power block further comprises a power block interconnect, electrically coupled to the interconnect circuitry of the chip package, the power block interconnect comprising at least one power block conductive through hole.

* * * * *

UNITED STATES PATENT AND TRADEMARK OFFICE
CERTIFICATE OF CORRECTION

PATENT NO. : 11,538,753 B2
APPLICATION NO. : 16/465255
DATED : December 27, 2022
INVENTOR(S) : Hossain et al.

It is certified that error appears in the above-identified patent and that said Letters Patent is hereby corrected as shown below:

On the Title Page

On page 2, in Column 1, item (56) under "Omar Publications", Line 1, delete ""Internationai" and insert --"International-- therefor In the Claims In Column 10, Line 43, in Claim 1, delete "side;" and insert --side,-- therefor In Column 12, Line 56, in Claim 19, delete "careless" and insert --coreless-- therefor Signed and Sealed this
Second Day of January, 2024

Katherine Kelly Vidal
*Director of the United States Patent and Trademark Office*